(12) United States Patent
Morita

(10) Patent No.: US 6,545,274 B1
(45) Date of Patent: Apr. 8, 2003

(54) METHODS AND DEVICES FOR DETERMINING TIMES FOR MAINTENANCE ACTIVITY PERFORMED ON A CHARGED-PARTICLE-BEAM MICROLITHOGRAPHY APPARATUS, AND MICROELECTRONIC-DEVICE-MANUFACTURING METHODS COMPRISING SAME

(75) Inventor: Kenji Morita, Kawagoe (JP)

(73) Assignee: Nikon Corporation, Tokyo (JP)

( * ) Notice: Subject to any disclaimer, the term of this patent is extended or adjusted under 35 U.S.C. 154(b) by 85 days.

(21) Appl. No.: 09/653,824

(22) Filed: Sep. 1, 2000

(30) Foreign Application Priority Data

Sep. 2, 1999 (JP) ............................................ 11-248499

(51) Int. Cl.[7] ............................................ H01J 37/244
(52) U.S. Cl. ...................... 250/307; 250/397; 250/492.2
(58) Field of Search ................................ 250/307, 397, 250/310, 492.2

(56) References Cited

U.S. PATENT DOCUMENTS

| | | | | |
|---|---|---|---|---|
| 4,665,315 A | * | 5/1987 | Bacchetti et al. | 250/492.1 |
| 5,146,098 A | * | 9/1992 | Stack | 250/492.2 |
| 5,999,886 A | * | 12/1999 | Martin et al. | 702/31 |
| 6,038,015 A | * | 3/2000 | Kawata | 250/492.2 |
| 6,124,718 A | * | 9/2000 | Kawata | 324/570 |
| 6,392,738 B1 | * | 5/2002 | Pasch et al. | 355/30 |

* cited by examiner

Primary Examiner—Bruce Anderson
(74) Attorney, Agent, or Firm—Klarquist Sparkman LLP

(57) ABSTRACT

Methods and apparatus are disclosed for performing charged-particle-beam (CPB) microlithography, in which states of contamination of any of various components in the CPB column are monitored. From data concerning state(s) of contamination of one or more components, information is provided regarding when system cleaning is required (i.e., cleaning intervals). Thus, problems such as degradation of resolution and increased beam deflection distortion over time are avoided, and consistently more accurate pattern transfers are performed. Detection of contaminants on selected component(s) can be performed by mass analysis of contaminant molecules released from the component(s) during irradiation of the component(s) with the charged particle beam. Mass analysis data are routed to a control computer, which analyzes a correlation between the types and amounts of molecules of a specific contaminant and detected beam-position variance arising from accumulated contaminant. From the correlation, the control computer predicts an optimal schedule for performing maintenance activities of the component(s), such as cleaning or component replacement.

25 Claims, 5 Drawing Sheets

METHODS AND DEVICES FOR DETERMINING TIMES FOR MAINTENANCE ACTIVITY PERFORMED ON A CHARGED-PARTICLE-BEAM MICROLITHOGRAPHY APPARATUS, AND MICROELECTRONIC-DEVICE-MANUFACTURING METHODS COMPRISING SAME

FIELD OF THE INVENTION

This invention pertains to microlithography of a pattern, defined by a reticle, to a sensitive substrate using a charged particle beam such as an electron beam or ion beam. Microlithography is a key technology used in the manufacture of microelectronic devices such as integrated circuits and displays. More specifically, the invention pertains, in the context of charged-particle-beam (CPB) microlithography, to methods and devices for accurately determining proper times (e.g., prescribed intervals) for performing scheduled maintenance (e.g., cleaning or replacement) of certain components of the apparatus.

BACKGROUND OF THE INVENTION

In recent years, as the critical dimensions of electronic devices in integrated circuits have become progressively smaller, the resolution limitations of optical microlithography have become increasingly apparent. Hence, much attention has been focused on the development of alternative microlithography technologies offering better resolution than optical microlithography. For example, microlithography using a charged particle beam (e.g., electron beam or ion beam) has been the subject of considerable development effort.

Although current charged-particle-beam (CPB) microlithography apparatus offer prospects of high resolution and exposure accuracy, the throughput obtainable with currently available equipment is disappointingly low. Various approaches are being investigated to improve throughput without adversely affecting image quality or imaging accuracy.

In one approach, the pattern to be transferred (by CPB microlithography) to a substrate is divided, or segmented, on the reticle into a large number of subfields or analogous exposure units that are exposed individually. This approach is termed "divided-reticle" projection exposure.

Various components used in a CPB microlithography apparatus are subject to accumulation of contaminants, which can cause degradation or drift in performance of the apparatus. For example, irradiation of the resist layer on the substrate can cause outgassing of organic compounds from the resist. Also, CPB-optical systems (including reticle and substrate) must be evacuated during use. Components located adjacent to evacuation ports can become contaminated by deposits of oil from the vacuum pumps used to evacuate the CPB-optical system.

Hence, in any of various CPB microlithography approaches, in order to form accurate patterns consistently over time, cleaning of various components (e.g., electrodes, apertures, and the like) in the CPB-optical system must be performed. Conventionally, such cleaning is performed on a predetermined periodic basis, such as every six months or year. However, an optimal cleaning interval depends upon the conditions (e.g., beam current or frequency of rough pump-down) of use and how often or how much the CPB microlithography apparatus is used. Hence, attention currently is being given to establishing scheduled cleaning intervals based on experience, with appropriate margins applied.

However, whenever a problem such as significant beam instability arises (which can degrade pattern accuracy), cleaning of the CPB-optical system is indicated regardless of whether a scheduled cleaning is due. Contamination of the CPB-optical system usually is manifest as deposits of hydrocarbons (from outgassing of resist and residual vapor of pump oil) that adhere especially to components situated around the trajectory of the charged particle beam. The longer the apparatus is operated, the greater the volume of contaminant deposits. Deposits of contaminant hydrocarbons are usually electrically insulative. Deposits of insulative contaminants on an aperture or on the reticle entrap charged particles and thus experience localized "charge-up," which creates random electric fields in the vicinity of the deposits. The random electric fields perturb beam trajectory, with an attendant loss of transfer accuracy and resolution due to beam blur. The severity of charge-up varies with beam current and the actual amount of contaminant(s) in the respective deposits.

Whenever cleaning intervals are based on experience, certain systems may in fact go too long without being cleaned, or time may be wasted by cleaning certain components or systems more often than necessary. Failure to clean a system promptly when cleaning is necessary can degrade pattern-transfer resolution and increase distortions caused by beam deflections. These problems can be avoided by constantly monitoring and measuring of resolution and beam deflection. Unfortunately, such monitoring and measurements require large amounts of time and fail to identify individual components requiring cleaning.

SUMMARY OF THE INVENTION

In view of the shortcomings of conventional methods and apparatus as summarized above, an object of the present invention is to provide charged-particle-beam (CPB) microlithography methods and apparatus that provide accurate and timely information of the proper time (prescribed interval) for performing scheduled cleaning of the apparatus. Thus, the present invention solves problems such as degraded resolution and increased beam-deflection distortions caused by insufficient or inadequate cleaning. Another object is to provide semiconductor-device-manufacturing methods employing such microlithography methods and apparatus.

To such ends, and according to a first aspect of the invention, methods are provided (in the context of CPB microlithography methods) for detecting a time for a maintenance activity performed on a component in the column of a CPB microlithography apparatus. According to a representative embodiment of such a method, the component is subjected to a condition tending to cause release of molecules of a contaminant from the component to an atmosphere in the column. The atmosphere within the column is analyzed (e.g., by mass analysis) to detect an amount of a contaminant released from the component. From data produced during the analysis, a time for performing the maintenance activity of the component is determined according to the results of the detection. The condition to which the component is subjected can be, for example, irradiation of the component with the charged particle beam. The steps of irradiating the component and analyzing the atmosphere inside the column can be performed simultaneously and can be performed on multiple components in the column at the same time. The resulting data from the determinations can include times for performing the maintenance activity as determined individually for each component. The analysis can be performed at any of various times such as during startup of the column.

The method can include the step of determining a variance in beam positioning arising as a result of accumulation of the contaminant on the component. In this regard, the method can further include the step of determining a correlation between accumulation of the contaminant on the component and the variance in beam positioning. Data concerning the correlation can be stored in a memory for subsequent recall. Hence, the method can further include the step of recalling the data from the memory and determining the time for performing the maintenance activity of the component according to the recalled data.

Another aspect of the invention is directed to CPB microlithography apparatus that comprise a CPB-optical column. The apparatus includes a device for detecting an amount of a contaminant on a component of the CPB-optical column. According to a representative embodiment, such a device comprises a deflector situated and configured to direct a charged particle beam, propagating through the column, to impinge on the component and thus cause release of molecules of the contaminant. A sensor is situated and configured to detect the released molecules of the contaminant. The device also includes an analyzer (e.g., mass analyzer) connected to the sensor. The analyzer is configured to receive data from the sensor and to determine, from the data, a type and amount of the contaminant on the component. The apparatus can include a beam-position-measurement system situated and configured to detect a characteristic of a trajectory of the charged particle beam passing through the column. In such a configuration, the analyzer and beam-position-measurement system desirably are connected to a computer that is configured to determine a correlation between the detected amount of the contaminant and the characteristic of the trajectory of the charged particle beam.

The computer additionally can be configured to determine a time for performing a maintenance action on the component based on the determined correlation. The computer can include a memory situated and configured to store data from the analyzer concerning the contaminant, the state of use of the microlithography apparatus, and the history of prior maintenance activities concerning the component.

The sensor in the apparatus described above can be configured to detect molecules of the contaminant from the atmosphere inside the column.

The apparatus additionally can include multiple deflectors each situated and configured to direct the charged particle beam, propagating through the column, to impinge on each of multiple respective components in the column and thus cause release of molecules of respective contaminants from the respective components. Such an apparatus includes multiple sensors each situated and configured to detect the released molecules of the respective contaminant from the respective component. The apparatus also includes a respective analyzer connected to each sensor, wherein each analyzer is configured to receive data from the respective sensor and to determine, from the data, a type and amount of the respective contaminant on the respective component. In such an apparatus, the computer also can include a memory situated and configured to store data from the analyzer concerning the contaminant, the state of use of the microlithography apparatus, and the history of prior maintenance activities concerning the component. The computer further can be configured to recall data from the memory and to determine, from the recalled data, a time for performing a maintenance action on the component.

According to another aspect of the invention, semiconductor-fabrication processes are provided that include a method or are performed using an apparatus as summarized above.

In any event, by detecting the respective contaminant and contaminant level for one or more components in the CPB column, the timing of maintenance actions such as column cleaning or component replacement readily can be determined. By measuring, for example, contaminant molecules (e.g., hydrocarbon molecules) present in the atmosphere inside the column, column-maintenance procedures can be scheduled based on the measurements. Hence, the time at which cleaning or replacement will be necessary can be predicted with greater accuracy, thereby reducing degradation of pattern-transfer accuracy due to conditions such as charge-up and beam-trajectory variances. Furthermore, column maintenance can be performed at a stage in which maintenance can be performed readily without performing a major overhaul of the column. By performing contaminant detection simultaneously at multiple locations inside the column, the timing of component cleaning at various locations inside the column, as well as component replacement as required, can be determined individually for each subject location and component in the column according to the results of the detection. This provides detailed information as to which locations in the column have a contaminant buildup and which do not, thereby facilitating the avoidance of unnecessary maintenance work.

By determining a correlation between degree of contamination of a specific component and beam-position variance, detailed information can be obtained as to the degree to which the microlithography system is being degraded by contamination buildup (especially in terms of loss of resolution and beam-deflection distortion). This allows more informed decisions regarding the proper corrective action and when to take such action.

The foregoing and additional features and advantages of the invention will be more readily apparent from the following detailed description, which proceeds with reference to the accompanying drawings.

DETAILED DESCRIPTION

The invention is described in connection with representative embodiments. The representative embodiments are described as employing an electron beam as a representative charged particle beam. However, it will be understood that the same principles readily can be applied to use of another type of charged particle beam, such as an ion beam.

Figure 1:
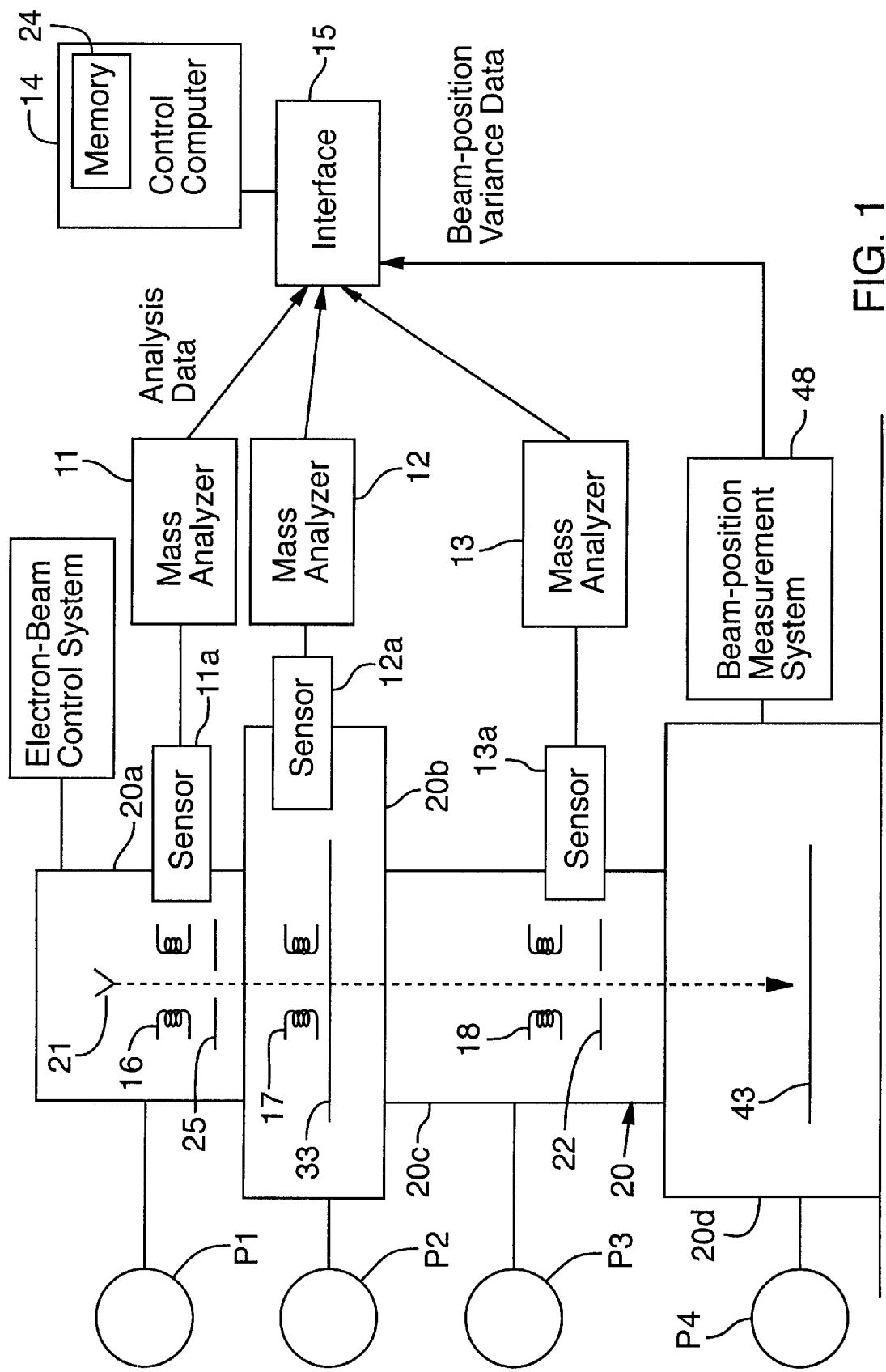
FIG. 1 is a schematic elevational diagram of certain aspects of a charged-particle-beam (CPB) microlithography apparatus according to a representative embodiment of the present invention, including components utilized for detecting contaminants in the column of the apparatus.
Figure 2:
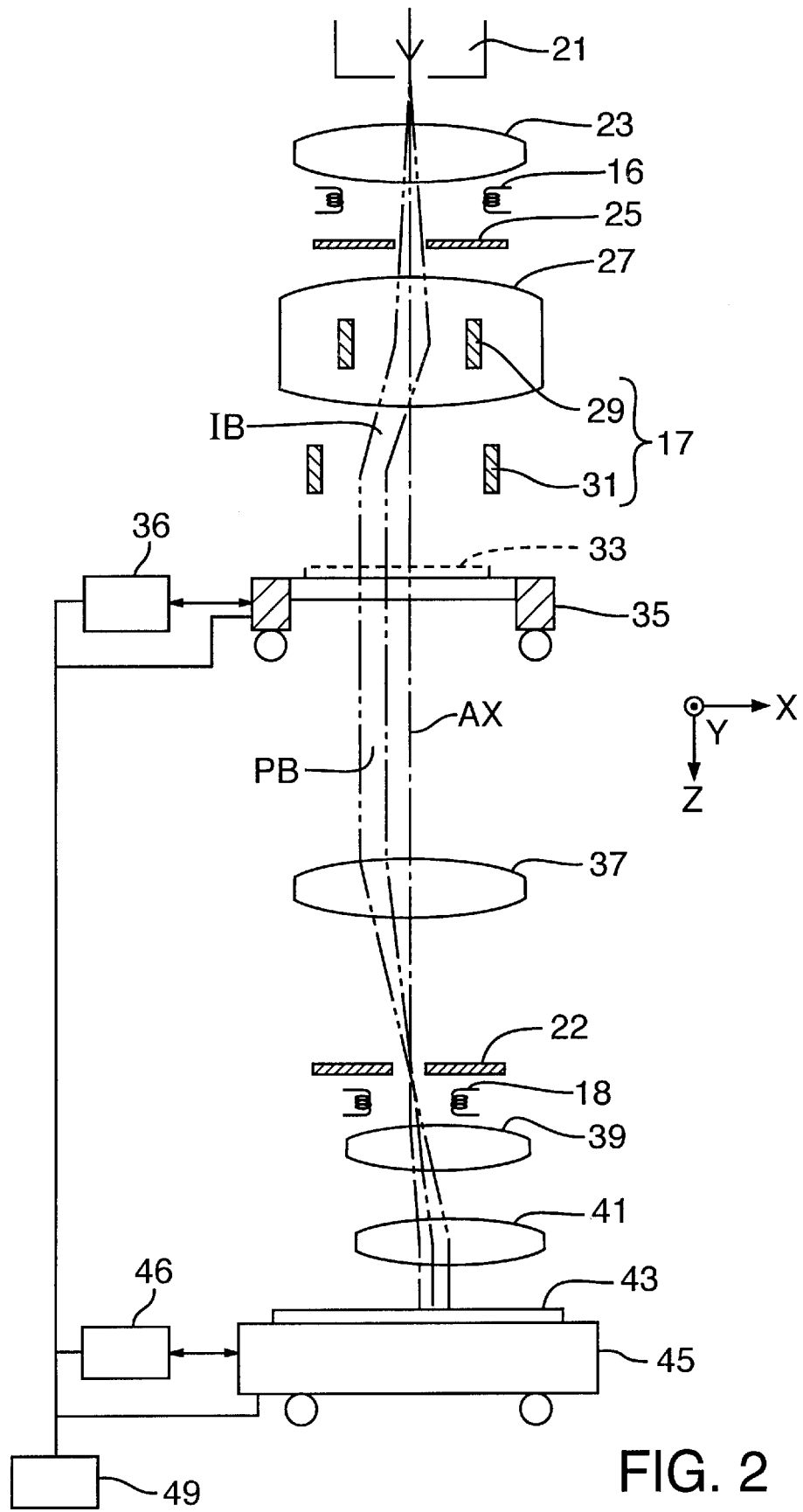
FIG. 2 is an optical diagram showing imaging relationships in the CPB-optical system of the apparatus of FIG. 1.

A schematic block diagram of a first representative embodiment of a charged-particle-beam (CPB) microlithography apparatus according to the invention is provided in FIG. 1. FIG. 2 depicts certain imaging relationships of the CPB-optical system of the FIG. 1 embodiment. A representative control system for measuring changes (shifts) in beam position is diagrammed in FIG. 3.

Referring to FIG. 2, an electron gun 21 is situated at the most upstream end of the CPB-optical system. The electron gun 21 emits an electron beam that propagates along an axis AX in the downstream direction. Situated downstream of the electron gun 21 are a first illumination lens 23, a deflector 16, a beam-shaping aperture 25, a second illumination lens 27, and a deflector assembly 17, all of which constitute an "illumination-optical system." Downstream of the illumination-optical system is a reticle 33 that defines the pattern to be transferred to a substrate (e.g., semiconductor wafer) 43. The electron beam passing through the illumination-optical system from the electron gun 21 to the reticle 33 is termed the "illumination beam" IB.

More specifically, the illumination beam IB passes through the first illumination lens 23 and is deflected by the deflector 16 to illuminate the beam-shaping aperture 25. The beam-shaping aperture 25 trims the illumination beam IB as required to provide the illumination beam with a transverse profile adequate to illuminate the desired exposure unit on the reticle 33. An image of the beam-shaping aperture 25 is formed on the reticle 33 by the second illumination lens 27.

The deflector assembly 17 is situated downstream of the beam-shaping aperture 25. The deflector assembly 17 comprises two beam-scan deflectors 29, 31. The beam-scan deflectors 29, 31 sequentially scan the illumination beam IB in the horizontal direction in FIG. 2 (termed herein the "X-axis direction") to illuminate the desired exposure units of the reticle 33. The second illumination lens 27 is positioned at the same point on the Z-axis as the beam-scan deflector 29 (the more upstream deflector of the deflector assembly 17). The second illumination lens 27 forms an image of the beam-shaping aperture 25 on the reticle 33.

The reticle 33 is mounted on a reticle stage 35 that is movable in directions (X-axis directions and Y-axis directions) perpendicular to the optical axis (Z-axis direction) of the CPB optical system. The substrate 43 (generally termed herein a "wafer") has an upstream-facing surface that is coated with a suitable resist so as to be "sensitive" to being imprinted with the reticle pattern. The wafer 43 is mounted on a wafer stage 45 that also is movable in the X-axis and Y-axis directions. While scanningly moving the reticle stage 35 and wafer stage 45 in opposite directions along the Y-axis (i.e., perpendicular to the plane of the page), the illumination beam is scanned in the X-axis direction by the deflector assembly 17.

Associated with the stages 35, 45 are respective position-measurement systems 36, 46. For high measurement accuracy, the position-measurement systems 36, 46 employ respective laser interferometers to measure the positions of the respective stages 35, 45. Data from the position-measurement systems 36, 46 are routed to a stage driver 49 connected to a computer (not shown but discussed below)

Downstream of the reticle 33 is a two-stage projection-lens assembly comprising a first projection lens 37, a second projection lens 41, and a deflector 18. As the illumination beam is incident on an exposure unit of the reticle 33, particles of the beam passing through the illuminated exposure unit become "patterned" according to the pattern portion defined in the illuminated exposure unit. As a result, the beam propagating downstream of the reticle 33 is termed the "patterned beam" PB. The patterned beam PB is demagnified by passage through the projection lenses 37, 41 and deflected by the deflector 18 to be imaged in a prescribed location on the wafer 43. To be imprintable with the projected pattern, the upstream-facing surface of the wafer 43 is coated with an appropriate "resist." As the resist is exposed with the images of the exposure units, it progressively acquires a latent image of the entire pattern defined on the reticle 33.

A focus-correction lens 39 desirably is situated upstream of the second projection lens 41. The focus-correction lens 39 corrects the effects of Coulomb interactions, aberrations, etc., of the patterned beam in the various transferred exposure units. Upstream of the focus-correction lens 39 is a scatter-limiting aperture 22 situated and configured to block electrons scattered by non-patterned regions of the reticle 33. Although FIG. 2 shows the deflector 18 located downstream of the scatter-limiting aperture 22, the deflector 18 (or an additional deflector) more desirably is located upstream of the scatter-limiting aperture 22, as shown in FIG. 1.

The optical components described above that are situated between the reticle 33 and the wafer 43 collectively are termed the "projection-optical system" through which the patterned beam propagates from the reticle 33 to the wafer 43. The combination of the illumination-optical system and the projection-optical system is termed the electron-optical system (or more generally the CPB-optical system).

As shown in FIG. 1, the entire CPB-optical system is situated in a vacuum chamber 20. The vacuum chamber 20 comprises a first compartment 20a containing the electron gun 21, deflector 16, and beam-shaping aperture 25; a second compartment 20b containing the deflector assembly 17 and reticle 33; a third compartment 20c containing the deflector 18 and scatter-limiting aperture 22; and a fourth compartment 20d containing the wafer 43. The compartments 20a–20d are evacuated by respective vacuum pumps P1–P4. The entire CPB-optical system located inside the vacuum chamber 20 is termed a "column."

Figure 4:
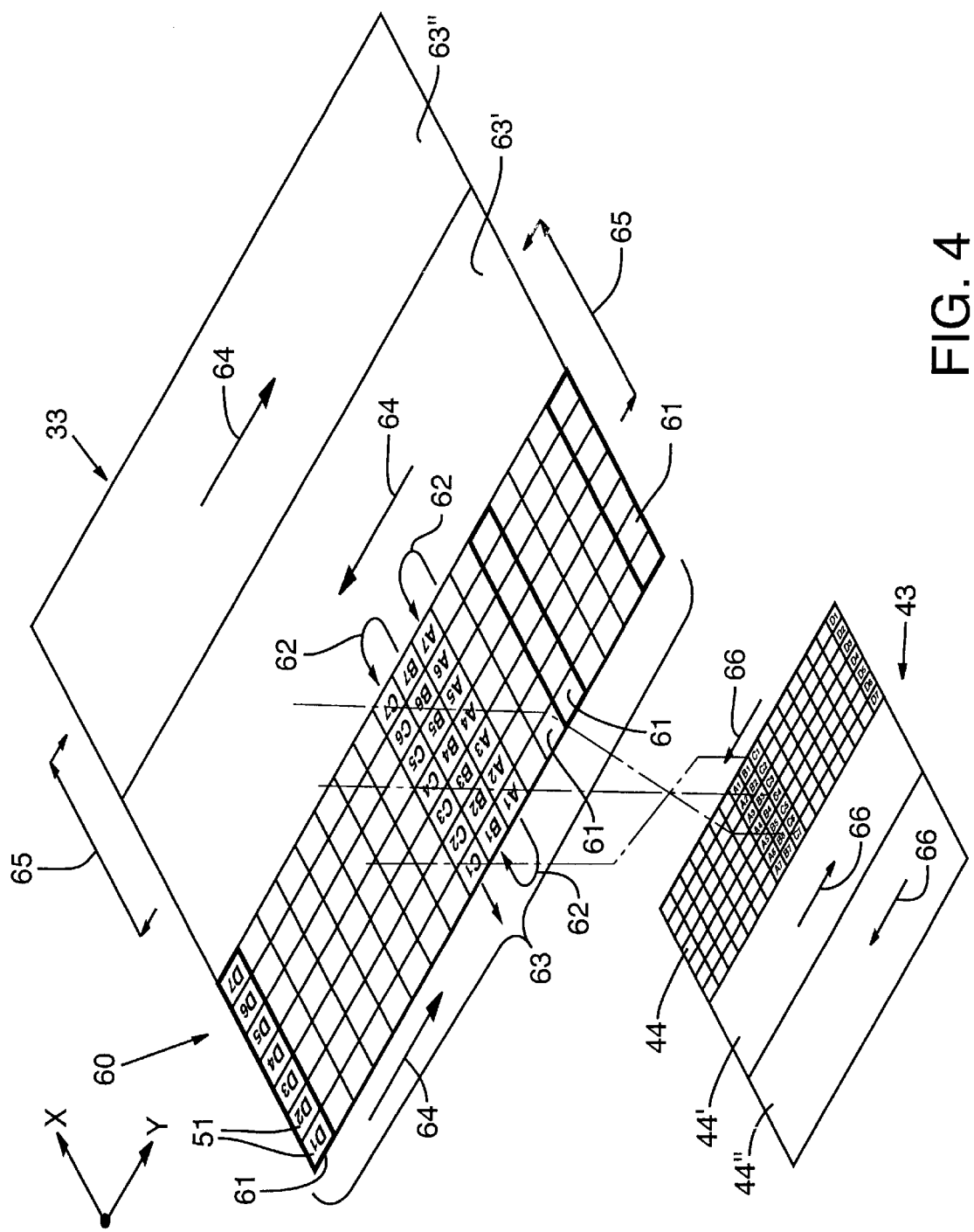
FIG. 4 is an oblique view of certain aspects of scanning exposure as performed by the FIG.-1 embodiment, including use of a segmented reticle.

Certain aspects of the reticle 33 and its use for making a microlithographic exposure using the apparatus of FIG. 2 are shown in FIG. 4. The reticle 33 can be a scattering-stencil reticle or a scattering-membrane reticle. In a scattering-stencil reticle, a pattern of voids (through holes) is defined (e.g., by etching) in a silicon membrane. Particles of the illumination beam readily pass through the voids with essentially no scattering, but are scattered if incident on the membrane itself. In a scattering-membrane reticle, the pattern is defined by a patterned film of highly scattering material applied to a silicon membrane. Particles of the illumination beam readily pass through the membrane with little scattering, but are scattered if incident on the highly scattering material.

The reticle 33 typically contains a pattern that is coextensive with an entire die or "chip" 60. On the reticle 33, the chip pattern normally is rectangular in profile and is divided or "segmented" into multiple exposure units termed "subfields" 51. Each subfield 51 typically is square, with sides measuring, for example, 1 mm on the reticle 33 and (according to a 1/4 demagnification ratio of the projection lenses 37, 41) 0.25 mm on the wafer 43. The patterned region of each subfield 51 is surrounded by a non-patterned region (not shown) having a width on the reticle of approximately 0.1 mm. In an actual reticle, the midline of each non-patterned region is substantially thicker than other regions of the reticle (e.g., 1 mm thick compared to about 2 $\mu$m thick for the patterned region of a subfield). The thick regions essentially are "struts" providing the reticle with rigidity and mechanical strength.

The representative segmented reticle 33 of FIG. 4 has a large number of subfields 51 arranged in "scan rows" 61 (X-direction) and columns (Y-direction). A scan row 61 typically has a length, on the reticle, of 20 to 40 mm. On the reticle, several tens to several hundreds of scan rows 61 are arranged side-by-side as a column in the Y-direction. Such a column of scan rows 61 is termed a "stripe" 63 (in FIG. 4, the chip pattern 60 comprises three stripes 63, 63', 63"). The stripes 63 are arranged side-by-side in the X-direction. For example, the stripe 63 has multiple scan rows 61 each containing seven subfields 51 arrayed in the X-direction. The subfields of the stripes 63' and 63" are not detailed. Although FIG. 4 shows the subfields 51 of the scan rows 61 segmented from each other, in an alternative configuration the subfields 51 in each scan row are contiguous with no segmentation between the subfields 51.

To expose a stripe 63, the illumination beam is swept (scanned) continuously in a raster manner (arrows 62) in the X-axis direction to irradiate the subfields 51 in each scan row 61 sequentially. Meanwhile, the reticle stage 35 moves the reticle 33 in the Y-axis direction (arrow 64) so that the scan rows 61 of subfields in the stripe 63 can be irradiated in a sequential manner while the wafer stage 45 moves the wafer 43 synchronously in the opposite Y-axis direction (arrows 66). (The opposite-direction movements of the stages 35, 45 are due to the projection-optical system inverting the image, as formed on the wafer, relative to the reticle pattern.) More specifically, in the figure, the illumination beam is swept back and forth in the X-axis direction to irradiate the subfields $A_7$–$A_1$ in a scan row 61, the subfields $B_1$–$B_7$ in a next scan row 61, and the subfields $C_7$–$C_1$ in the next scan row 61 in a sequential manner. Finally, the illumination beam sequentially irradiates the subfields $D_7$–$D_1$ in the last scan row 61 to complete exposure of the first stripe 63. During exposure of the scan rows 61 in the first stripe 63, the reticle stage 35 and wafer stage 45 are moving continuously in opposite Y-axis directions (arrows 64, 66, respectively). When exposure of the first stripe 63 is complete, the reticle stage 35 "steps" (arrow 65) in the X-direction to position the next stripe 63' in the reticle for exposure. The substrate stage 45 makes a similar stepping motion in the X-axis direction.

As the illumination beam illuminates each subfield 51, the beam has a transverse profile (e.g., square) that is slightly larger than the patterned region of the subfield 51. The patterned beam "transfers" the respective image of each illuminated subfield 51 to a corresponding location on the wafer 43. As shown in FIG. 4, due to the demagnification ratio of the projection lenses 37, 41, the image of each subfield as formed on the wafer 43 is smaller (according to the ratio) than the corresponding subfield 51 on the reticle 33. During exposure of the subfields 51, images of the non-patterned regions are not transferred; i.e., the non-patterned regions effectively are "cancelled" at the substrate. As a result, the subfield images on the wafer 43 are "stitched" together to form a contiguous image of the entire chip 60.

As noted above, the demagnification ratio can be, by way of example, 1/4. Under such conditions, assuming overall chip dimensions (for a 4-Gigabit DRAM) of 27 mm (X-direction) by 44 mm (Y-direction) as formed on the wafer, the corresponding pattern on the reticle would have dimensions of 120 to 150 mm (X-direction) by 150 to 250 mm (Y-direction), including the non-patterned regions.

The wafer 43 shown in FIG. 4 comprises corresponding stripes 44, 44', 44". FIG. 4 also depicts images of the subfields $A_1$–$A_7$, $B_1$–$B_7$, $C_1$–$C_7$, and $D_1$–$D_7$ as formed on the wafer 43, illustrating the arrangement of subfield images on the wafer relative to the arrangement of the corresponding subfields 51 on the reticle 33.

Hence, respective continuous exposures are made within each stripe 63 of a chip pattern as defined on the reticle 33. The illumination beam is deflected in the X-axis direction, over each scan row 61 in a continuous raster fashion (with accompanying continuous and synchronous movements of the stages 35, 45 in the respective Y-axis directions), and from one stripe 63 to the next in a step-and-repeat manner in the X-direction. (After exposing a stripe 63, exposure momentarily stops while the stages 35, 45 are repositioned to allow exposure of the next stripe 63.) The respective deflections of the illumination beam and patterned beam required to achieve pattern transfer must account for these motions in the Y-axis direction so that the beams will be directed to the proper respective locations on the reticle and wafer. For exposure, a stripe 63 desirably is positioned at or close to the optical axis AX. Also, as each scan row 61 is being exposed, corrective adjustments for focus and certain aberrations also can be made dynamically to obtain low-aberration projected images on the wafer 43.

Returning to FIG. 1, this embodiment also includes a plurality of mass analyzers 11, 12, 13 (e.g., mass spectrometers). Each mass analyzer 11–13 is connected to a respective sensor 11a, 12a, 13a. The sensors 11a, 12a, 13a are situated at separate locations near the beam-shaping aperture 25, the reticle stage 35, and the scatter-limiting aperture 22, respectively. The sensors 11a, 12a, 13a are configured to detect molecules of contaminant(s) in the respective compartments 20a, 20b, 20c of the vacuum chamber 20. The sensors can be configured to detect one or more specific classes of compounds (e.g., hydrocarbons released from the resist during exposure of the wafer 43). Data from the sensors 11a, 12a, 13a are routed to the respective mass analyzers 11–13, respectively. The mass analyzers 11–13 are configured to analyze the data and identify types and amounts of contaminants sensed by the respective sensor 11a–13a.

Each of the deflectors 16, 17, 18 is operated under the control of the control computer 14. Each deflector 16, 17, 18 is energized by a respective driver (not shown). The control computer 14 generates appropriate signals that are routed to the respective drivers to controllably deflect the beam. For example, the deflector 16 is deflected controllably in a manner by which the trajectory of the beam can be affected by contaminant deposits on the beam-shaping aperture 25. Similarly, the deflector 18 is deflected controllably in a manner by which the trajectory of the beam can be affected by contaminant deposits on the scatter-limiting aperture 22.

The mass analyzers 11–13 are connected to an interface 15 connected to a control computer 14. In the depicted embodiment, the interface 15 converts analog data from the mass analyzers into a digital form that readily can be processed by the control computer 14.

The control computer 14 has several additional functions. For example, the control computer 14 monitors, via respective data generated by the mass analyzers 11–13, the respective states of contamination of the beam-shaping aperture 25, the reticle stage 35, and the scatter-limiting aperture 22. The control computer 14 comprises a memory 24 configured to store data such as any of the following: (1) data, produced by the mass analyzers 11, 12, 13, regarding specific contaminants as detected by the respective sensors 11a, 12a, 13a; (2) prevailing conditions under which the CPB microlithography apparatus is being used; (3) cleaning/replacement history of specific components of the CPB microlithography apparatus; and (4) measurement data concerning changes in beam position, obtained by a beam-position-measurement system 48, discussed below. The control computer 14 analyzes the stored data for correlations between a particular detected contaminant and a change in beam position resulting from the presence or accumulation of the contaminant. From the results of such calculations, the control computer 14 predicts when system maintenance (e.g., cleaning or component replacement) is required.

During detection of contaminants, the control computer 14 causes the beam-shaping aperture 25 to be illuminated by the illumination beam IB. To such end, the illumination beam IB is deflected as required by the deflector 16 to scan the illumination beam over the beam-shaping aperture 25. As the illumination beam IB is being scanned in this manner, it contacts deposits of any contaminants that have formed or accumulated at or near the opening defined by the beam-shaping aperture 25. Contact of the deposits by the illumination beam causes release of gaseous substances from the deposits. The gaseous substances are detected by the sensor 11a and analyzed by the mass analyzer 11. The mass analyzer 11 routes a signal encoding data concerning the type and amount of the contaminant(s) to the interface 15. As noted above, the contaminants normally comprise mainly various hydrocarbons ($C_xH_y$). The magnitude of adverse effects to the microlithography apparatus due to the contaminants is determined by sensing and determining the amount of carbon in the released gaseous substances.

Similarly, the deflector assembly 17 scans the illumination beam and the deflector 18 scans the patterned beam in a manner, as described above, by which the respective beam contacts contaminant deposits in the vicinity of the reticle stage 35 and scatter-limiting aperture 22, respectively. Released gaseous substances are detected by the sensors 12a and 13a, respectively, and analyzed by the mass analyzers 12 and 13, respectively.

Detection of contaminants can be performed on any convenient schedule. For example, detections can be performed daily.

Figure 3:
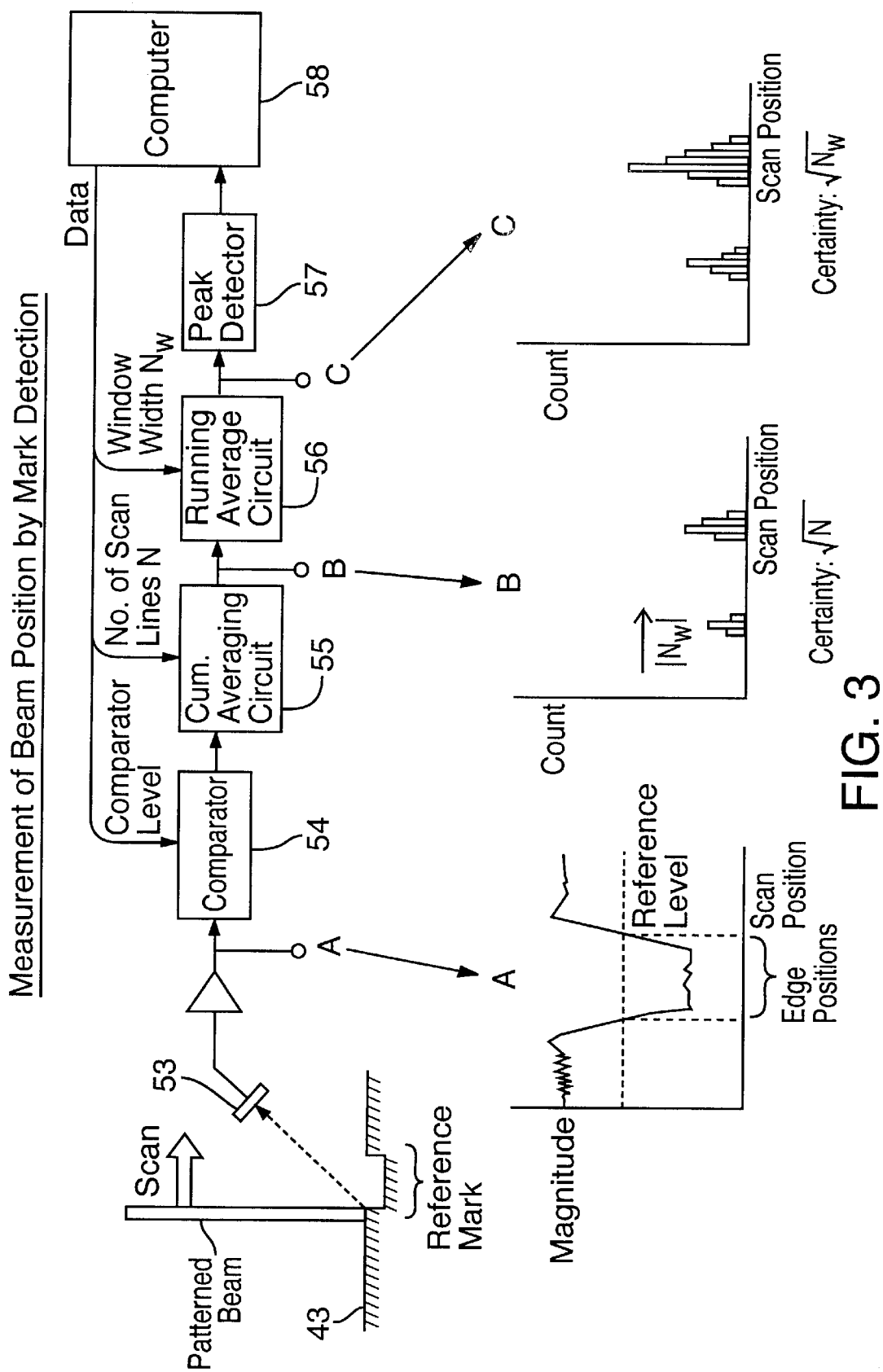
FIG. 3 is a schematic block diagram of a beam-position measurement system of the FIG.-1 embodiment.

Changes in beam position resulting from contaminant accumulation are measured by a beam-position-measurement system 48, an example embodiment of which is depicted in FIG. 3. Meanwhile, the positions of the reticle stage (providing data on reticle position) and of the wafer stage (providing data on wafer position) are monitored. The beam-position-measurement system 48 comprises a backscattered-electron (BSE) detector 53 situated and configured to detect electrons backscattered from a reference mark.

Beam position is measured on the wafer, using a reference mark on the wafer stage ("wafer mark") and a corresponding reference mark on the reticle or reticle stage ("reticle mark"). (Example wafer marks and reticle marks have a "cross" or "line-and-space" configuration.) The illumination beam is directed onto the reticle mark to produce a patterned beam propagating downstream of the reticle mark, through the projection lenses, to the wafer mark. The illumination beam and patterned beams are scanned as they illuminate the respective reference marks. (Such scanning is performed by deflectors as discussed above.) Charged particles backscattered from the wafer mark are detected by the BSE detector 53. Meanwhile, the respective positions of the reticle stage and wafer stage are measured by the respective position-measurement systems. From data concerning the respective positions of the reticle stage and wafer stage, and from data encoded in the signal from the BSE detector, beam position can be determined accurately.

Reference now is made to the embodiment of a beam-position measurement system shown in FIG. 3, which provides highly accurate and reliable data on the positions of reference marks. In this embodiment, data from the BSE detector 53 are routed to the following components in series: a comparator 54, a cumulative averaging circuit 55, a running-average circuit 56, and a peak detector 57, then to a computer 58 (which can be the same as the control computer 14 discussed above). Measurement of beam position is substantially the same as measuring mark position. Generally, to detect the position of a mark, the edges of mark element(s) are detected, and the midpoint between respective edges represents the position of the respective mark element or mark. Hence, the task is to determine the respective positions of the edges.

In FIG. 3, "A" is exemplary data as produced by the BSE detector 53 (and amplified) as the patterned beam, propagating from a reference mark at the reticle or reticle stage, is scanned over a mark on the wafer 43. A reference level (baseline) to which the comparator compares data from the BSE detector is indicated by a dotted line. The amplitude of the signal from the BSE detector is indicated by a solid-line plot. Respective edge positions are indicated where the BSE-detector-signal plot crosses over the baseline. As evident in the figure, the "A" plot typically has sloping sides and includes some noise. The sloping sides and noise contribute some uncertainty as to the exact positions of the edges of the mark.

To eliminate the effects of noise and obtain a signal that more accurately indicates the positions of edges, beam scanning and production of BSE-detector data are repeated N times, and the results of individual determinations are averaged. Exemplary results (plotted as a histogram) are indicated in plot "B" representing data from the cumulative averaging circuit 55. In plot "B", the two peaks indicate determined edge positions, and the certainty of determining actual edge positions has been increased by $(N)^{1/2}$.

Data with even further increased certainty are provided by the running-average circuit 56. The running-average circuit averages data in plot "B" within successive respective windows (having width $N_w$) from left to right. This is especially useful whenever a peak in plot "B" is asymmetrical. The running-average circuit 56 averages the data in each window. The larger the width $N_w$ of the window, the greater the certainty that is provided (certainty is determined by $(N_w)^{1/2}$). Representative results of such an analysis are provided in plot "C" representing the output of the running-average circuit 56. From this data, the peak detector 57 determines the positions of peaks representing actual edges of marks. Meanwhile, based at least in part on the data output from the peak detector 57, the computer 58 produces-or recalls the following data: (1) data concerning the reference level for the comparator 54, and outputs such data to the comparator 54; (2) data concerning the number of scans N to be performed, and outputs such data to the cumulative averaging circuit 55; and (3) data concerning the window width $N_w$, and outputs such data to the running-average circuit 56. The computer 58 also monitors data received from the respective position-measurement systems associated with the reticle stage and wafer stage.

As noted above, the computer 58 can be the control computer 14 discussed above, thereby eliminating the need to have and use two separate computers.

It is noted that plots "A", "B", and "C" are provided to illustrate representative results of data processing as performed by the BSE detector 53, cumulative averaging circuit 55, and running-average circuit 56, respectively. These plots normally are not displayed to a user, although they can be if desired.

Also from the data output by the peak detector 57, the computer 58 calculates effects on beam position from propagation of the beam past the respective locations monitored by each detector 11a, 12a, 13a. The computer 58 also compares present data on beam position against previously obtained data, and correlates the data so as to determine the change in beam position over time with a corresponding change in amount of contaminant at the respective location in the vacuum chamber 20. In other words, the amount of contaminant accumulation at a respective location is determined directly from the actual beam position and the change in beam position over time as the beam propagates past the location. The computer 58 also compares present beam position with a threshold value for beam-position shift representing a "critical value" of contaminant accumulation. If the critical value is exceeded, then cleaning or replacement of the respective component is indicated.

The computer 58 also stores data concerning initial system contamination (contaminant components detected at initial startup of the column) and the resulting shift in beam position. These correlative data typically are stored in a memory of the computer. Based on the stored data, the timing of required system maintenance (cleaning of components inside the column, component replacement, etc.) can be predicted simply from the analysis data.

From data generated by the analyzers 11a, 12a, 13a, respective profiles of beam-position change versus amount of contaminant accumulation are not necessarily the same. This is to be expected since the different target locations inside the vacuum chamber typically experience different rates of contaminant accumulation. Also, greater amounts of contamination may be more tolerable in some locations than in other locations. Monitoring contaminant accumulation over time provides individual contaminant profiles for each monitored location, which is a great benefit in terms of determining when maintenance is or will be required for the target component(s) in the respective locations.

The threshold value of beam-position shift is based at least in part on the required accuracy demanded of the subject microlithography apparatus. By storing time-based profiles, as tables or equations, of beam position versus contaminant accumulation for later recall and analysis, determinations readily can be performed of when to clean or replace the target components in the column. Also, by providing such monitoring on a real-time basis, required maintenance can be performed on a more timely basis, and more accurate predictions can be made of how long a particular apparatus can be operated without having to perform a maintenance activity.

Figure 5:
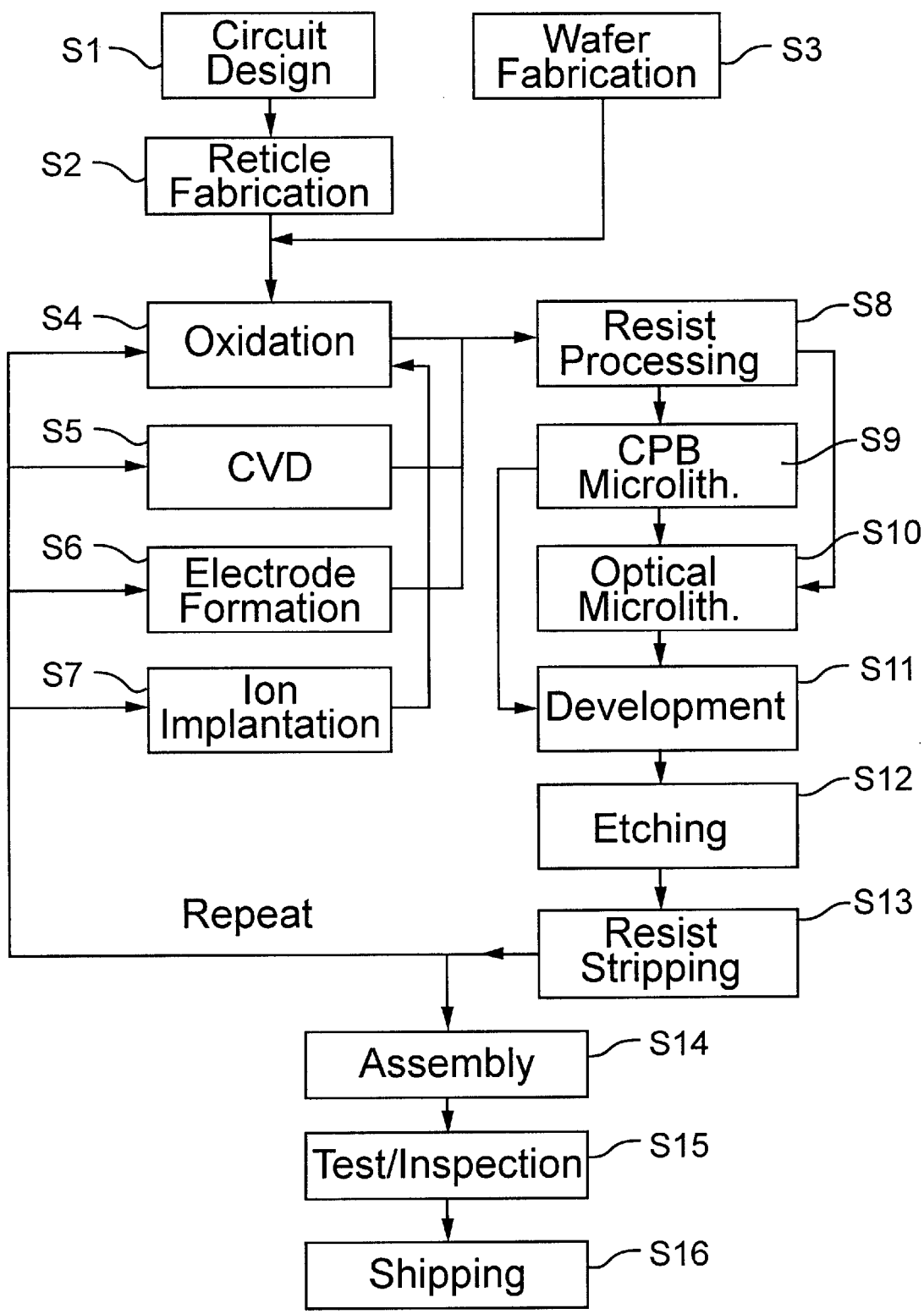
FIG. 5 is a flow chart of steps in a process for manufacturing a microelectronic device (semiconductor integrated circuit, liquid-crystal panel, CCD, thin-film magnetic head, micromachine, etc.).

FIG. 5 is a flow chart of steps in a process for manufacturing a microelectronic device such as a semiconductor chip (e.g., an integrated circuit or LSI device, a display panel (e.g., liquid-crystal panel), CCD, thin-film magnetic head, or micromachine, for example).

In step S1 (circuit design) the circuit is designed. In step S2 (reticle fabrication), a reticle is fabricated that defines the circuit pattern corresponding to the designed circuit. In step S3 (wafer fabrication) a wafer or other suitable substrate is fabricated using a material such as silicon.

Steps S4–S13 are directed to wafer-processing steps, specifically "pre-process steps. In the pre-process steps, a circuit pattern defined on the reticle is transferred onto the wafer by microlithography. Step S14 is an assembly step (termed a "post-process" step) in which the wafer that has been processed through steps S4–S13 is formed into microelectronic chips or other suitable units. This step can include, e.g., assembling the devices (dicing and bonding) and packaging (encapsulation of individual chips). Step S15 is a test and inspection step in which any of various operability and qualification tests of the device produced in step S14 are conducted. Afterward, microelectronic devices that successfully pass step S15 are finished, packaged, and shipped (step S16).

Steps S4–S13 provide representative details of wafer processing. In step S4 (oxidation), the surface of the wafer is oxidized. In step S5 (CVD) an insulating film is formed on the surface of the wafer by chemical vapor deposition. In step S6 (electrode forming) electrodes are formed on the wafer by, e.g., vapor deposition. In step S7 (ion implantation) impurity ions are implanted in the wafer. In step S8 (resist processing) the wafer is coated with a "resist" sensitive, in a latent-image-forming way, to exposure by the patterned beam. In step S9 (CPB microlithography) an exposure is performed in a CPB microlithography apparatus using the reticle fabricated in step S2, to transfer a latent image of the circuit pattern (defined by the reticle) to the resist on the wafer. In step S10 (optical microlithography) a circuit pattern defined by a reticle is exposed onto the wafer using an optical stepper.

Although the depicted method employs a "mix and match" scheme in which both CPB and optical microlithography can be used as required, all circuit layers of the microelectronic device can, of course, be formed by respective CPB microlithography steps only. Analysis of the atmosphere (and thus contaminants) within the column, as described above, is performed at an appropriate time during any of these exposure operations.

In step S11 (development) the exposed wafer is developed (i.e., the exposed resist is developed). In step S12 (etching) portions other than the resist-image portions are removed selectively from the wafer. In step S13 (resist stripping) unwanted resist remaining after completion of etching is removed. Subsequent circuit-pattern layers are formed over existing layers on the wafer by repeating steps S4 through S13 as required.

As is clear from the above description, appropriate times for performing component cleaning or replacement can be determined with substantially greater accuracy than conventionally. Hence, problems such as resolution degradation and increased beam-deflection distortion over time can be avoided, to thereby obtain consistently accurate pattern transfers.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a method for performing microlithography of a pattern, defined on a reticle, to a resist-coated substrate using a charged particle beam passing through a charged-particle-beam (CPB) optical system contained in a CPB column, a method for detecting a time for a maintenance activity performed on a component of the CPB optical system in the column, the method comprising:

(a) subjecting the component to a condition tending to cause release of molecules of a contaminant from the component to an atmosphere in the column;

(b) analyzing the atmosphere within the column to detect an amount of a contaminant released from the component; and (c) from data obtained in step (b), determining a time for performing the maintenance activity of the component according to the results of the detection.

2. The method of claim 1, wherein step (a) comprises irradiating the component with the charged particle beam.

3. The method of claim 1, wherein steps (a) and (b) are performed simultaneously.

4. The method of claim 1, wherein:

steps (a)–(b) are performed simultaneously on multiple components in the column; and in step (c), respective times for performing the maintenance activity are determined individually for each component according to the results obtained in step (b).

5. The method of claim 1, wherein steps (a)–(b) are performed during startup of the column.

6. The method of claim 5, further comprising the step of determining a shift in beam position arising as a result of accumulation of the contaminant on the component.

7. The method of claim 6, further comprising the step of determining a correlation between accumulation of the contaminant on the component and the shift in beam position.

8. The method of claim 7, further comprising the step of storing data, concerning the correlation, in a memory for subsequent recall.

9. The method of claim 8, wherein step (c) further comprises recalling the data from the memory and determining the time for performing the maintenance activity of the component according to a contamination profile prepared from the recalled data.

10. The method of claim 1, wherein step (b) comprises performing a mass analysis of the released molecules of the contaminant.

11. The method of claim 10, wherein the mass analysis is performed by producing a mass spectrogram of the molecules.

12. In a charged-particle-beam microlithography apparatus comprising a CPB-optical column, a device for detecting an amount of a contaminant on a component of the CPB-optical column, the device comprising:

a deflector situated and configured to direct a charged particle beam, propagating through the column, to impinge on the component and thus cause release of molecules of the contaminant from the component;

a sensor situated and configured to detect the released molecules of the contaminant; and an analyzer connected to the sensor, the analyzer being configured to receive data from the sensor and to determine, from the data, a type and amount of the contaminant on the component.

13. The apparatus of claim 12, wherein the analyzer is a mass analyzer.

14. The apparatus of claim 13, further comprising a computer connected to the analyzer and to the beam-position-measurement system, the computer being configured to determine a correlation between the detected amount of the contaminant on the component and the characteristic of the trajectory of the charged particle beam.

15. The apparatus of claim 14, wherein the computer is further configured to determine a time for performing a maintenance action on the component based on the determined correlation.

16. The apparatus of claim 15, wherein the computer further comprises a memory situated and configured to store data from the analyzer concerning the contaminant, a state of use of the microlithography apparatus, and a history of prior maintenance activities concerning the component.

17. The apparatus of claim 12, further comprising a beam-position-measurement system situated and configured to detect a characteristic, as affected by the amount of contamination on the component, of a trajectory of the charged particle beam passing through the column.

18. The apparatus of claim 17, wherein the beam-position-measurement system comprises a detector situated and configured to detect backscattered charged particles from a reference mark on a substrate processed by the CPB microlithography apparatus.

19. The apparatus of claim 18, further comprising a comparator connected to the detector, a cumulative averaging circuit connected to the comparator, a running-average circuit connected to the cumulative averaging circuit, and a peak detector connected to the running-average circuit, the comparator being configured to compare a signal from the detector with a reference level, the cumulative averaging circuit being configured to determine an average, over N scans of data output from the comparator, the running-average circuit being configured to determine running averages within a window width $N_w$ of data output from the cumulative averaging circuit, and the peak detector being configured to determine peaks of data output from the running-average circuit.

20. The apparatus of claim 19, further comprising a computer connected to the peak detector, the running-average circuit, the cumulative averaging circuit, and the comparator, the computer being configured to route reference-level data to the comparator, data on N to the cumulative averaging circuit, and data on $N_w$ to the running average circuit, and to process data from the peak detector to determine beam position.

21. The apparatus of claim 12, wherein the sensor is configured to detect molecules of the contaminant from an atmosphere inside the column.

22. The apparatus of claim 12, further comprising:

multiple deflectors each being situated and configured to direct the charged particle beam, propagating through the column, to impinge on each of multiple respective components in the column and thus cause release of molecules of respective contaminants from the respective components;

multiple sensors each being situated and configured to detect the released molecules of the respective contaminant from the respective component; and a respective analyzer connected to each sensor, each analyzer being configured to receive data from the respective sensor and to determine, from the data, a type and amount of the respective contaminant on the respective component.

23. The apparatus of claim 22, wherein:
   the computer further comprises a memory situated and configured to store data from the analyzer concerning the contaminant, a state of use of the microlithography apparatus, and a history of prior maintenance activities concerning the component; and
   the computer is further configured to recall data from the memory and to determine, from the recalled data, a time for performing a maintenance action on the component.

24. A semiconductor-fabrication process, comprising the steps of:
   (a) preparing a wafer;
   (b) processing the wafer; and
   (c) assembling devices formed on the wafer during steps (a) and (b), wherein step (b) comprises the steps of (i) applying a resist to the wafer; (ii) exposing the resist; (iii) and developing the resist; and step (ii) comprises providing a charged-particle-beam microlithography apparatus as recited in claim 12; and using the charged-particle-beam microlithography apparatus to expose the resist with the pattern defined on the reticle.

25. A semiconductor device produced by the process of claim 24.

* * * * *